US006689658B2

(12) United States Patent
Wu

(10) Patent No.: US 6,689,658 B2
(45) Date of Patent: Feb. 10, 2004

(54) METHODS OF FABRICATING A STACK-GATE FLASH MEMORY ARRAY

(75) Inventor: Ching-Yuan Wu, Hsinchu (TW)

(73) Assignee: Silicon Based Technology Corp., Hsinchu (TW)

( * ) Notice: Subject to any disclaimer, the term of this patent is extended or adjusted under 35 U.S.C. 154(b) by 140 days.

(21) Appl. No.: 10/055,954

(22) Filed: Jan. 28, 2002

(65) Prior Publication Data

US 2003/0143790 A1 Jul. 31, 2003

(51) Int. Cl.[7] .............................................. H01L 21/336
(52) U.S. Cl. ...................... 438/257; 438/258; 438/259; 257/321; 257/315
(58) Field of Search .................. 257/321–315, 257/332; 438/257, 258, 294–296

(56) References Cited

U.S. PATENT DOCUMENTS 6,093,606 A * 7/2000 Lin et al. .................... 438/259

2002/0102793 A1 * 8/2002 Wu ............................ 438/257
2003/0073291 A1 * 4/2003 Tseng ......................... 438/296

* cited by examiner

Primary Examiner—Dung A Le
(74) Attorney, Agent, or Firm—Pro-Techtor International

(57) ABSTRACT

Methods of fabricating a stack-gate flash memory array are disclosed by the present invention, in which a self-aligned integrated floating-gate layer includes a major floating-gate layer formed on a thin tunneling dielectric layer and two extended floating-gate layers formed on planarized filed-oxides (FOX); a high-conductivity word line is formed by a composite conductive layer of metal or silicide/barrier-metal/doped polycrystalline- or amorphous-silicon as a control-gate layer and is encapsulated by the dielectric layers; a self-registered common-source/drain bus line is formed on a flat bed formed by common-source/drain diffusion regions and planarized field-oxides; a self-registered common-source/drain landing island is formed on a common-source/drain diffusion region to act as a self-aligned contact and a dopant diffusion source for forming a shallow heavily-doped commmon-source/drain diffusion region.

20 Claims, 14 Drawing Sheets

METHODS OF FABRICATING A STACK-GATE FLASH MEMORY ARRAY

BACKGROUND OF THE INVENTION

1. Field of the Invention

The present invention relates generally to a stack-gate flash memory array and its fabrication methods, and more particularly, to a high-density and high-performance stack-gate flash memory array and its fabrication methods.

2. Description of Related Art

Basically, flash memory devices can be divided into two categories: a stack-gate structure and a split-gate structure. The stack-gate structure is known to be a one-transistor cell, in which the gate length of a cell can be defined by using the minimum-feature-size of technology used; however, the split-gate structure including a floating gate and a select gate is known to be a 1.5-transistor cell. Therefore, the stack-gate structure is often used in high-density flash memory system.

A typical stack-gate flash memory device is shown in FIG. 1A, in which the programming operation is performed by using channel hot-electron injection to inject channel hot-electrons across the barrier height of the thin gate-oxide layer 101 into the floating-gate 102; the erasing operation is performed by using Fowler-Nordheim tunneling to tunnel stored electrons in the floating-gate 102 through the thin gate-oxide layer 101 into the double-diffused source region 105a, 107a. The formation of the double-diffused source region is mainly used to offer a larger overlapping area between the floating-gate and the source diffusion region in order to reduce the erasing time and simultaneously to eliminate the band-to-band tunneling effects as a positive voltage is applied to the source for erasing. However, as the stack-gate length is scaled down, the punch-through effect may be easily occurred for a double-diffused structure during the programming operation using channel hot-electron injection. As a consequence, the double-diffused structure becomes an obstacle for device scaling. Moreover, the programming efficiency of the channel hot-electron injection is low and the most part of the channel current is wasted, the programming time becomes longer for a high-density memory system due to the finite loading of the charge-pump circuit.

A stack-gate flash memory device having a symmetrical source/drain diffusion region 107a is shown in FIG. 1B and can be operated by two methods. The first operation method is that the stored electrons in the floating-gate 102 are tunneled through the thin gate-oxide layer 101 into the semiconductor substrate 100 using Fowler-Nordheim tunneling for the erasing operation; the channel hot-electron injection is used for the programming operation. For this kind of programming and erasing, the junction depth of the source/drain diffusion region can be made to be shallower and the doping concentration in the source/drain diffusion region can be higher. Although the punch-through effect of the device can be alliviated but is still a bottleneck of scaling. The second operation method is that the electrons in the source diffusion region 107a are tunneled through the thin gate-oxide layer 101 into the floating-gate 102 using Fowler-Nordheim tunneling for the erasing operation and the stored electrons in the floating-gate 102 are tunneled through the thin gate-oxide layer 101 into the drain diffusion region 107a for the programming operation. For this kind of programming and erasing, the junction depth of the source/drain diffusion region must be deeper and the doping concentration in the source/drain diffusion region can be lighter. However, the junction depth of the source/drain diffusion region must be shallower as the stack-gate length is scaled down, resulting in longer programming and erasing time.

As the stack-gate flash memory devices are integrated to form a memory array, the major issues encountered are device isolation, device contact, and interconnection. Basically, device isolation can be divided into two categories: local oxidation of silicon (LOCOS) and shallow-trench-isolation (STI). In general, the shallow-trench-isolation method occupies less silicon surface area and is more suitable for high-density memory fabrication. The device contact and the device interconnection in a memory array are arranged through a specified memory architecture and are formed in a matrix in order to have a higher packing density. The architecture of a flash memory array can be NOR, NAND, AND, and DINOR etc., in which NOR and NAND are frequently used. However, for any architecture, a plurality of isolation-region lines are formed over a semiconductor substrate in parallel having a plurality of active-region lines formed therebetween, a plurality of flash memory cells are formed regularly on each of active-region lines having the control-gate layer of each flash memory cell run over the field-oxides in the isolation-region lines to form a plurality of word lines perpendicular to the plurality of isolation-region lines, and the flash memory cells in each of active-region lines form a column and are interconnected by the common source/drain diffusion regions. For a NOR-type architecture, the common-drain diffusion regions of flash memory cells in each column have the contacts formed and are connected to a bit line perpendicular to the plurality of word lines, and a plurality of bit lines are then formed; the common-source diffusion regions of flash memory cells in each row are interconnected by possible means to form a common-source bus line in parallel with the word line, and a plurality of common-source bus lines are formed.

The common-source bus line of the prior arts is formed by first removing the field-oxides in the isolation-region lines and is then implanted with a high dose of doping impurities into the active regions and the isolation regions along a common-source bus line to form a buried common-source line, as shown in FIG. 1C and FIG. 1D, where FIG. 1C shows a cross-sectional view of a buried common-source line for LOCOS isolation; FIG. 1D shows a cross-sectional view of a buried common-source line for STI isolation. It is clearly seen from FIG. 1C and FIG. 1D that the bird's beak regions 107c of LOCOS isolation are difficult to be implanted uniformly, resulting in higher buried resistance; however, the steep sidewalls 107c of STI isolation are much difficult to be implanted uniformly. It should be noted that deeper buried layer doped or implanted isn't favorable to the shallower source/drain diffusion region needed for the scaled stack-gate flash memory device. Moreover, the parasitic junction capacitance and the leakage current between the buried common-source line and the semiconductor substrate can't be overlooked.

The bit line of the prior arts which is formed by the first interconnect-metal layer is connected to a silicide layer formed on a common-drain diffusion region through a contact hole filled with a tungsten plug over a barrier-metal layer, the contact size is in general larger than the minimum-feature-size in order to have a proper contact area over the common-drain diffusion region and becomes a technical bottleneck to be solved for high-density flash memory array. Moreover, the junction depth of the common-drain diffusion regions becomes shallower as the stack-gate flash memory device is scaled down, the contact problem between the bit line and the shallow common-drain diffusion region can't be overlooked. As the junction depth of the common source/drain diffusion regions becomes shallower, the higher series resistance resulting from the interconnection of stack-gate flash memory cells becomes an obstacle for high-speed read operation, together with the high series resistance of the buried common-source line formed at the source terminals of the source select transistors, the advantages of NAND-type architecture become disappeared.

In addition, the word line is connected with each of stack-gate flash memory cells in a row through the control-gate layer, the control-gate layer of the prior arts is made of a tungsten-silicide layer formed over a doped polycrystalline-silicon layer or a silicided polycrystalline layer, the sheet resistance becomes higher as the control-gate length becomes narrower due to the silicide agglomeration. A high-density memory array implies more flash memory cells being connected, the parasitic series resistance of the word line becomes largely increased, the RC delay of the word line becomes serious and the operation speed of flash memory becomes poorer.

According to the above description, no matter what kind of memory architecture is used, the flash memory array of the prior arts faces the following problems to be solved: (1) high parasitic series resistance and capacitance for common-source/drain bus line; (2) the scaling of contact size and the contact problem between the bit-line and the shallow source/drain diffusion regions; (3) high parasitic series resistance due to internal connection of flash memory cells through shallow source/drain diffusion region; (4) high parasitic series resistance of the long word line; and (5) the punch-through effect of a scaled stack-gate flash memory cell.

SUMMARY OF THE INVENTION

Methods of fabricating a stack-gate flash memory array are disclosed by the present invention, which include a method of fabricating a shallow-trench-isolation structure having a self-aligned integrated floating-gate layer; a method of fabricating a high-conductivity word line; a method of fabricating a self-registered common-source/drain bus line; and a method of fabricating a self-registered common-source/drain landing island.

The shallow-trench-isolation structure having the self-aligned integrated floating-gate layer includes a plurality of shallow-trench-isolation lines formed in parallel on a semiconductor substrate having a plurality of active-region lines formed therebetween, each of active-region lines includes a major floating-gate layer formed on a thin tunneling dielectric layer, each of shallow-trench-isolation lines includes two extended floating-gate layers formed on the side portion of planarized field-oxides (FOX), and each major floating-gate layer electrically connected with two extended floating-gate layers forms a self-aligned integrated floating-gate layer. The self-aligned integrated floating-gate layer is obtained by a sidewall spacer technique to form two extended floating-gate layers on the sidewalls of a major floating-gate layer. Therefore, a high coupling ratio can be easily obtained without the extra masking photoresist step and its misalignment. Moreover, the self-aligned integrated floating-gate layer offers a rather flat surface for forming a stack-gate structure.

A plurality of word lines perpendicular to the plurality of shallow-trench-isolation lines are formed on the flat shallow-trench-isolation structure having self-aligned integrated floating-gate layers formed, which include a control-gate layer sandwiched between a second masking dielectric layer formed on the top and an intergate dielectric layer formed at the bottom. The control-gate layer is a composite conductive layer of metal or silicide/barrier-metal/doped polycrystalline- or amorphous-silicon and is encapsulated by the dielectric layers. Therefore, the silicide agglomeration effects wouldn't occur and the parasitic series resistance of long word line can be much reduced.

The self-registered source/drain landing islands of the present invention are formed on the common-source/drain diffusion regions of stack-gate flash memory cells to act as the contacts and the self-aligned dopant diffusion sources for forming shallow heavily-doped source/drain diffusion regions. Therefore, the contact problem can be eliminated and the punch-through effects of short gate-length can be alliviated. The self-registered source/drain landing island is formed by a silicided heavily-doped polycrystalline- and amorphous-silicon layer, the series resistance of internal-connected stack-gate flash memory cells can be much reduced.

The self-registered common-source/drain bus line is located between the designated word lines and is formed on a flat bed formed by common source/drain diffusion regions and field-oxides, and is acted as the contacts and the self-aligned dopant diffusion sources for forming shallow heavily-doped source/drain diffusion regions. Therefore, the contact problem between the self-registered common-source/drain bus line and the shallow source/drain diffusion regions can be eliminated. Similarly, the self-registered common-source/drain bus line is formed by a silicided heavily-doped polycrystalline- and amorphous-silicon layer, the bus-line resistance can be much reduced, the parasitic capacitance and the leakage current between the bus line and the semiconductor substrate can be reduced accordingly.

BRIEF DESCRIPTION OF THE DRAWINGS

FIG. 1A through FIG. 1D show the schematic diagrams of the prior arts, in which FIG. 1A shows a cross-sectional view of a stack-gate flash memory device having asymmetrical source/drain diffusion regions; FIG. 1B shows a cross-sectional view of a stack-gate flash memory device having symmetrical source/drain diffusion regions; FIG. 1C shows a cross-sectional view along the buried common-source line for LOCOS isolation; and FIG. 1D shows a cross-sectional view along the buried common-source line for STI isolation;

FIG. 2A through FIG. 2E show the schematic diagrams of the present invention, in which FIG. 2A shows a top plan view of a NOR-type flash memory array; FIG. 2B shows a cross-sectional view of stack-gate flash memory cells in the bit-line direction (A–A' in FIG. 2A); FIG. 2C shows a cross-sectional view in the common-source bus line (CSBL) direction (B–B' in FIG. 2A); FIG. 2D shows a cross-sectional view in the drain diffusion line (DL) direction (C–C' in FIG. 2A); FIG. 2E shows a corss-sectional view in the word-line direction (D–D' in FIG. 2A);

DETAILED DESCRIPTION OF THE PREFERRED EMBODIMENTS

Figure 2A:
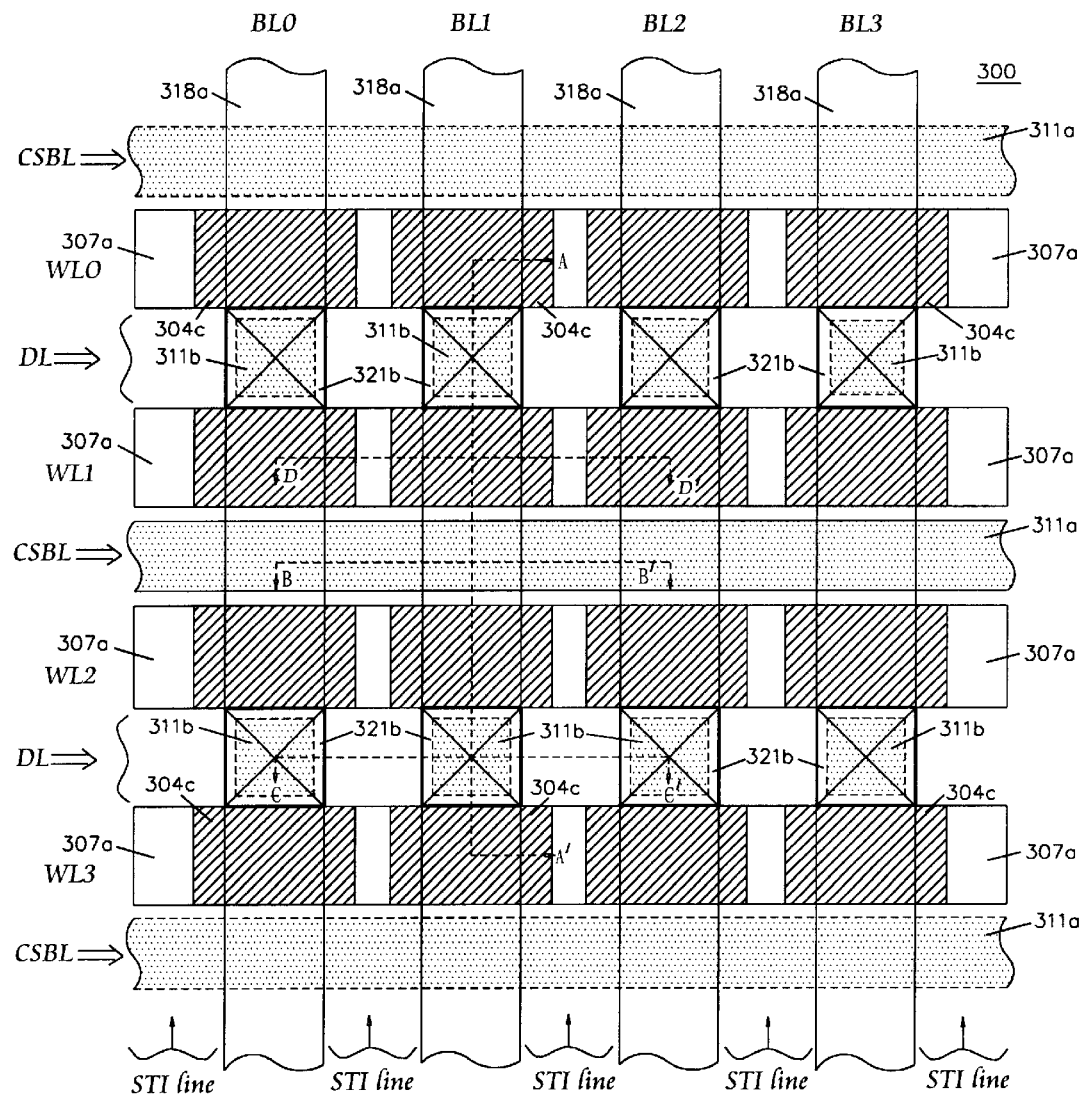
Figure 2B:
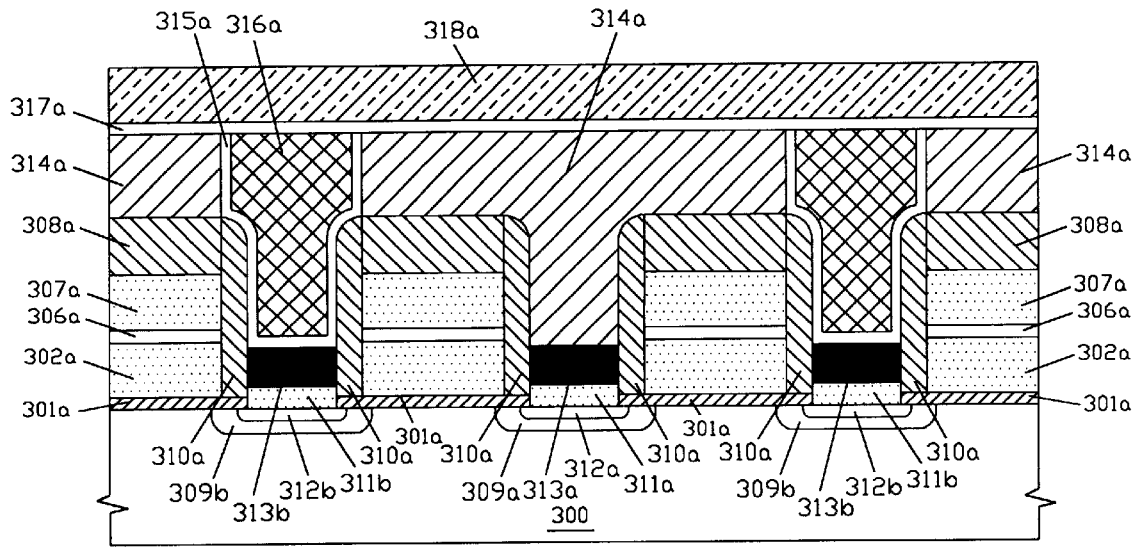
Figure 2C:
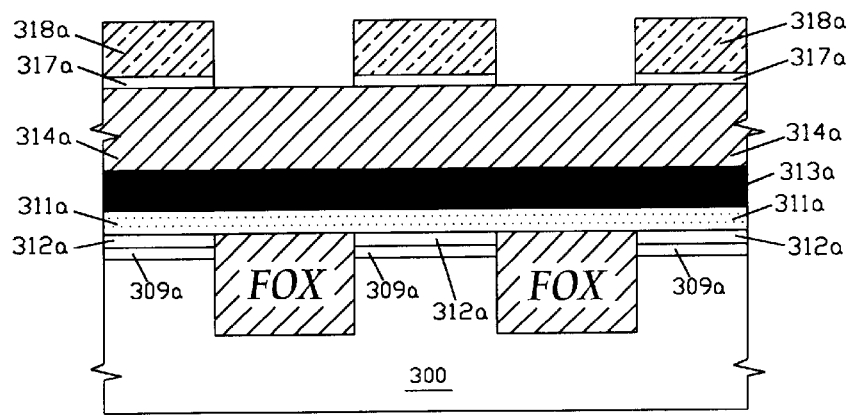
Figure 2D:
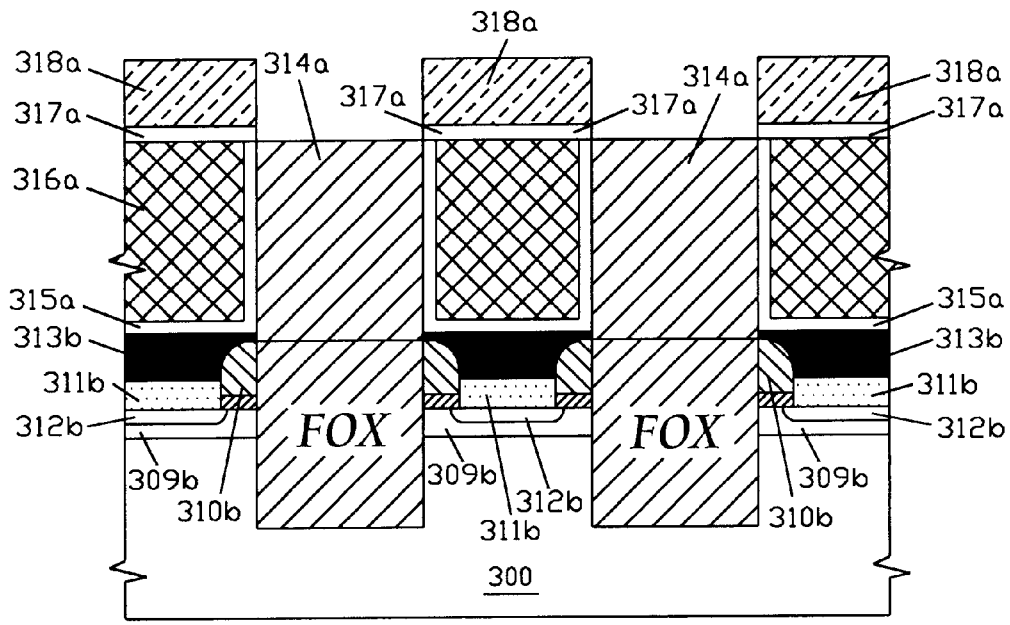
Figure 2E:
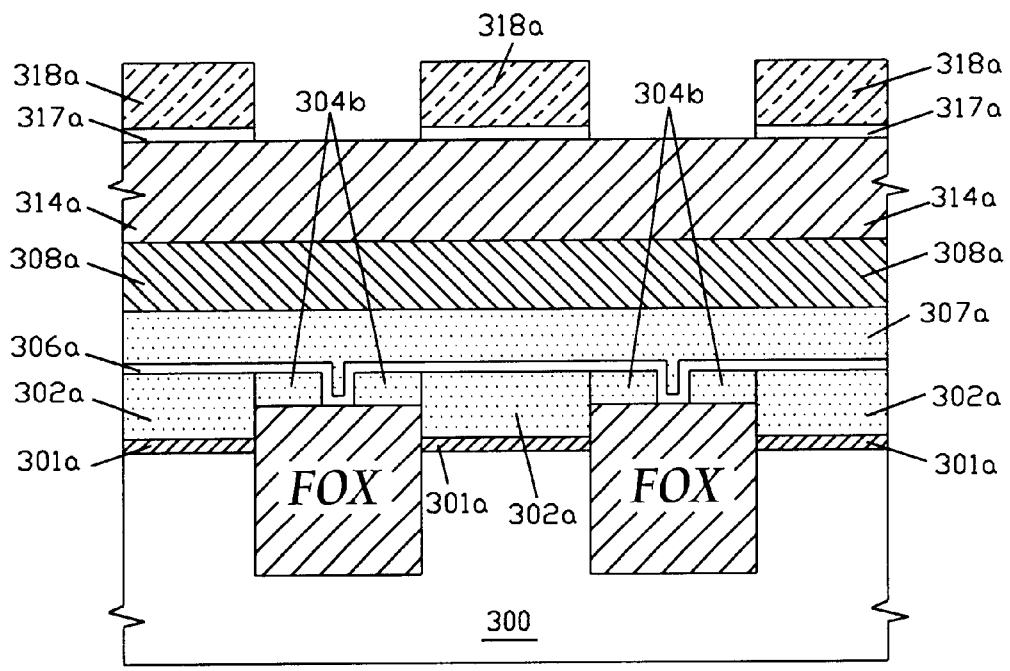

Referring now to FIG. 2A through FIG. 2E, there are shown the schematic diagrams of the present invention, in which FIG. 2A shows a top plan view of a NOR-type flash memory array of the present invention; FIG. 2B shows a cross-sectional view in the bit-line direction (A–A' in FIG. 2A); FIG. 2C shows a cross-sectional view in the common-source bus line (CSBL) direction (B–B' in FIG. 2A); FIG. 2D shows a cross-sectional view in the drain diffusion line (DL) direction (C–C' in FIG. 2A); and FIG. 2E shows a cross-sectional view in the word-line direction.

FIG. 2A shows a plurality of shallow-trench-isolation (STI) lines are formed in parallel on a semiconductor substrate 300 having a plurality of active-region lines formed therebetween; a plurality of word lines (WL) are formed perpendicularly to the plurality of shallow-trench-isolation lines and each of the word lines is formed by the control-gate layer 307a having a plurality of self-aligned integrated floating-gate layers 304c formed below and spaced by the intergate dielectric layers 306a; a plurality of self-registered common-source bus lines (CSBL) 311a is formed over the flat beds formed by common-source diffusion regions 312a and field-oxides (FOX) and are located in the common-source bus lines (CSBL) between the word lines; a plurality of self-registered drain landing islands 311b are formed over the common-drain diffusion regions 312b and the self-registered landing islands 311b in a drain diffusion line (DL) are connected to a bit line (BL) 318a through the contact holes 321b, and a plurality of bit lines 318a are formed perpendicularly to the plurality of word lines.

FIG. 2B shows a cross-sectional view in the bit-line direction (A–A' in FIG. 2A), in which a plurality of stack-gate flash memory cells are formed in an active-region line. The stack-gate flash memory cell includes a stack-gate structure having a second masking dielectric layer 308a, a control-gate layer 307a, an intergate dielectric layer 306a, a floating-gate layer 302a, and a thin tunneling dielectric layer 301a formed on a semiconductor substrate 300; a second dielectric spacer 310a is formed over the sidewalls of the stack-gate structure and on the thin tunneling dielectric layer 301a. The thin tunneling dielectric layer 301a is preferably a thermal-oxide layer or a nitrided thermal-oxide layer; the floating-gate layer 302a is a first conductive layer and is preferably made of doped polycrystalline-silicon or amorphous-silicon; the intergate dielectric layer 306a is preferably made of a composite dielectric layer such as silicon-oxide/silicon-nitride/silicon-oxide (ONO) or silicon-nitride/silicon-oxide; the control-gate layer 307a is a third conductive layer and is preferably made of a composite conductive layer such as metal or silicide/barrier-metal/doped polycrystalline- or amorphous-silicon; the second masking dielectric layer 308a is preferably a silicon-oxynitride layer or a silicon-nitride/silicon-oxide layer; the second dielectric spacer 310a is preferably made of silicon-nitrides. Note that the composite conductive layer is used as the control-gate layer 307a, in which the barrier-metal layer is used to prevent the interaction between metal or silicide and doped polycrystalline- or amorphous-silicon, so that the silicide agglomeration wouldn't be occurred and the high-conductivity nature of metal or silicide can be preserved. The metal layer is preferably made of high melting-point metal such as tungsten, the silicide layer is preferably made of tungsten-silicide, and the barrier-metal layer is preferably made of refractory-metal nitride such as titanium-nitride (TiN) or tantalum-nitride (TaN).

Figure 1A:
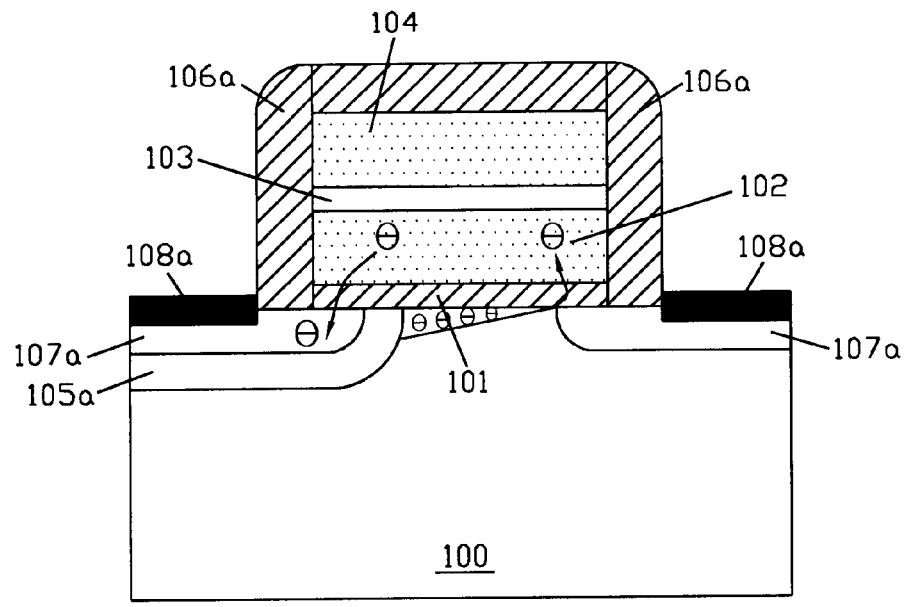
Figure 1B:
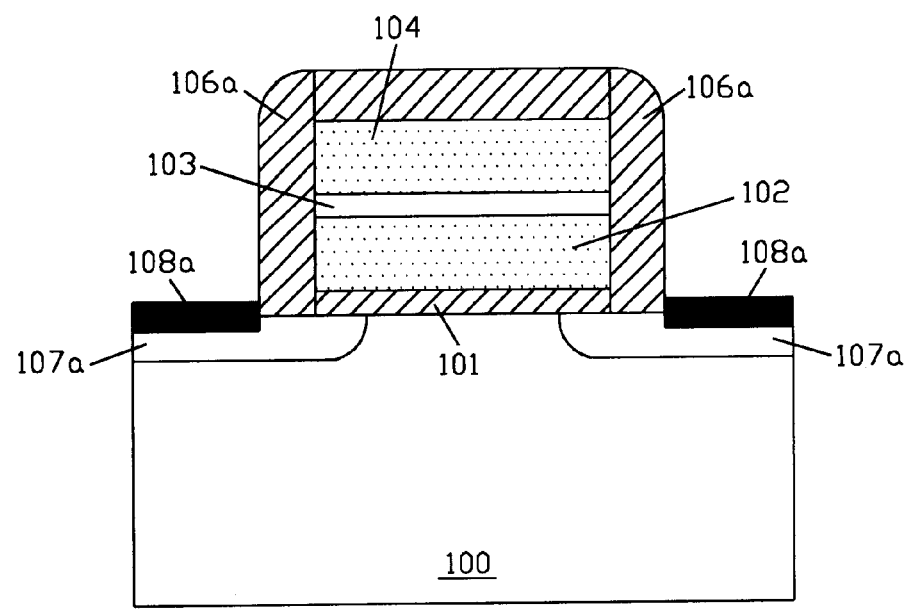
Figure 1C:
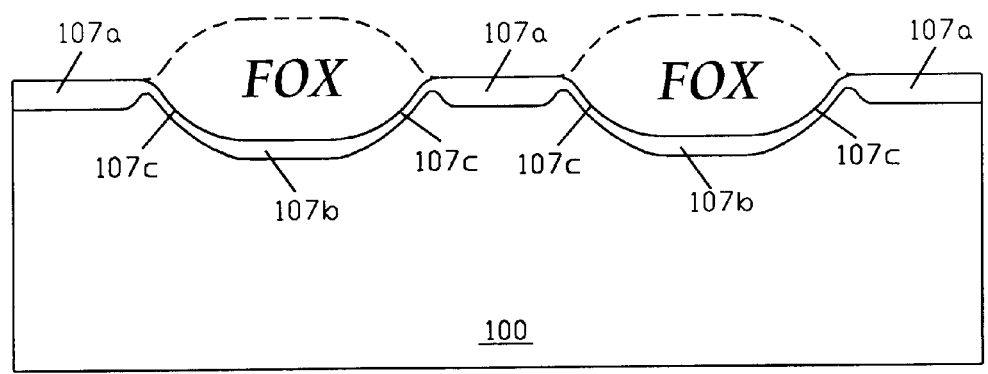
Figure 1D:
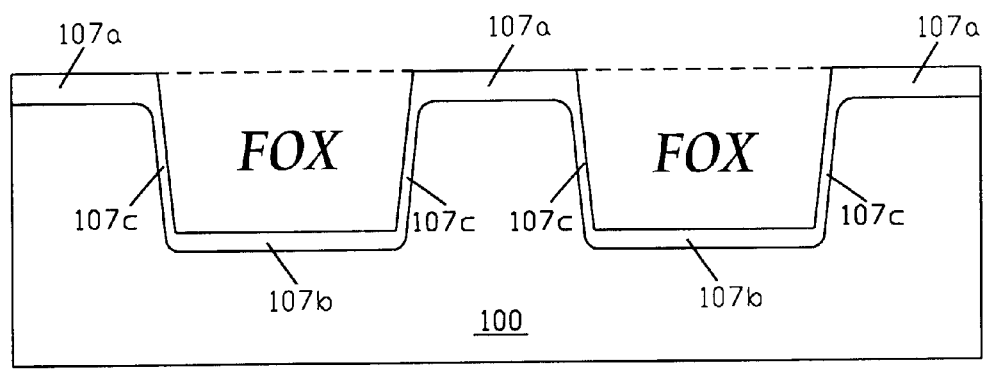

Now referring to FIG. 2B and FIG. 2C simultaneously, the self-registered common-source bus line 311a is formed between the second dielectric spacers 310a and is located on a flat bed formed by the source diffusion regions 312a and the field-oxides (FOX) and is silicided in a self-aligned manner to form a silicide layer 313a. The self-registered common-source bus line 311a is preferably made of polycrystalline-silicon or amorphous-silicon and is implanted with a high-dose of doping impurities to act as a dopant diffusion source for forming shallow heavily-doped common source diffusion regions 312a. The deeper source diffusion regions 309a can be formed simultaneously with respect to the deeper drain diffusion regions 309b shown in FIG. 2B to obtain symmetrical source/drain diffusion regions and can also be formed separately without the additional masking step to form asymmetrical source/drain diffusion regions (not shown), as will be discussed later. It should be noted that the doped polycrystalline- or amorphous-silicon layer 311a can be completely converted into a thick silicide layer 313a and the sheet resistance of the self-registered common-source bus line 311a can be further decreased. Compared to the buried common-source line shown in FIG. 1C and FIG. 1D, it is clearly visualized that the self-registered common-source bus line 311a of the present invention has lower bus-line resistance, lower bus-line capacitance and lower junction leakage current with respect to the semiconductor substrate 300.

Referring now to FIG. 2B and FIG. 2D simultaneously, the self-registered common-drain landing islands 311b are formed between the second dielectric spacers 310a and the third dielectric spacers 310b formed over the sidewalls of the field-oxides and are located on the common-drain diffusion regions 312b. The self-registered common-drain landing island 311b is also made of polycrystalline- or amorphous-silicon and is implanted with a high-dose of doping impurities to act as a dopant diffusion source for forming shallow heavily-doped common-drain diffusion regions 312b. Similarly, the self-registered common-drain landing island 311b is silicided in a self-aligned manner to form a silicide layer 313b and can be completely converted into a thick silicide layer. The bit line 318a formed on a second barrier-metal layer 317a is connected to the silicided self-registered common-drain landing islands 313b through the self-aligned contact holes 321b formed on the planarized interlayer dielectric film 314a and each contact hole is lined with a first barrier-metal layer 315a and is then filled with a planarized metal plug 316a. The first and second barrier-metal layers 315a, 317a are preferably made of refractory metal-nitrides such as TiN or TaN; the plug metal is preferably tungsten or aluminum; the bit-line 318a is formed by using the first interconnect metal layer and is preferably made of aluminum, aluminum-silicon-copper alloy or copper; the silicide layers 313a, 313b formed are preferably made of refractory metal-silicide such as $TiSi_2$, $CoSi_2$, $TaSi_2$, $MoSi_2$, $NiSi_2$, or $PtSi_2$. It is clearly visualized that the silicided self-registered common-drain landing island of the present invention is acted as not only a dopant diffusion source for forming shallow heavily-doped common-drain diffusion regions 312b but also an elevated buffer layer for contacts. Therefore, the contact problem for shallow diffusion region can be eliminated and the contact size 321b can be reduced.

Referring now to FIG. 2E and FIG. 2B simultaneously, FIG. 2E shows a cross-sectional view along the word-line direction. It is clearly seen that the self-aligned integrated floating-gate layer 304c shown in FIG. 2A is consisting of a major floating-gate layer 302a and two extended floating-gate layers 304b formed over the field-oxides (FOX). The extended floating-gate layer 304b is formed by a spacer technique, as will be shown later, no additional masking photoresist step is required to obtain a higher coupling ratio for the floating-gate. Moreover, the control-gate surface is quite flat for fine-line lithography.

Although the above description is mainly made for a NOR-type stack-gate flash memory array as an example, the key technologies as disclosed by the present invention can be easily applied to other array architectures for fabricating high-density and high-performance stack-gate flash memory array. The key technologies and their features of the present invention are summarized as follows:

(a) The planarized shallow-trench-isolation structure having self-aligned integrated floating-gate layer formed not only offer a flat control-gate surface for fine-line lithography of a plurality of narrow gate-lengths, but also offer a larger coupling ratio for the floating-gate of stack-gate flash memory cells without the additional masking photoresist step;

(b) The control-gate of stack-gate flash memory cells is formed by using a composite conductive layer of a metal or silicide/barrier-metal/doped polycrystalline- or amorphous-silicon structure and is encapsulated by high-density dielectric layers to eliminate the silicide agglomeration effect due to high-temperature annealing process, the high-conductivity nature of metal or silicide layer can be preserved and the parasitic resistance of long word line can be much reduced.

(c) The self-registered common-source/drain bus line being made of silicided heavily-doped polycrystalline- or amorphous-silicon is formed over a flat bed to reduce the parasitic bus-line resistance and is also acted as a self-aligned dopant diffusion source for forming shallow heavily-doped source/drain diffusion regions. Moreover, the parasitic capacitance and the leakage current between the common bus line and the semiconductor substrate can be much reduced.

(d) The self-registered common-source/drain landing island being made of silicided heavily-doped polycrystalline- or amorphous-silicon is acted as not only a self-aligned dopant diffusion source for forming shallow heavily doped source/drain diffusion regions but also an elevated buffer layer for contacts to increase the integrity of the contacts and further to reduce the contact size. Moreover, the self-registered common source/drain landing island may largely reduce the internal connection resistance of stack-gate flash memory cells; and (e) The source/drain diffusion region of the stack-gate flash memory cell can be formed to be asymmetrical without the additional masking photoresist step.

Figure 3A:
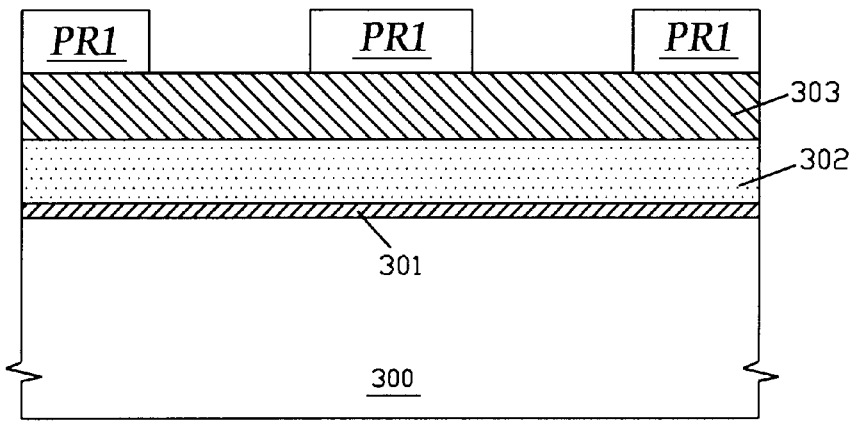
FIG. 3A through FIG. 3I show the process steps and their cross-sectional views for fabricating a shallow-trench-isolation structure having the self-aligned integrated floating-gate layer of the present invention.

Referring now to FIG. 3A through FIG. 3I, there are shown the process steps and their cross-sectional views for fabricating a planarized shallow-trench-isolation structure having self-aligned integrated floating-gate layers formed. FIG. 3A shows that a thin tunneling dielectric layer 301, a first conductive layer 302, and a first masking dielectric layer 303 are sequentially formed on a semiconductor substrate 300. A masking photoresist PR1 is formed on the first masking dielectric layer 303 and is patterned to define a plurality of active-region lines (under PR1) and a plurality of isolation-region lines (between PR1). The semiconductor substrate 300 can be a p-well or a p-type semiconductor substrate for fabricating n-channel memory devices; or the semiconductor substrate 300 can be an n-well or an n-type semiconductor substrate for fabricating p-channel memory devices. The figures shown thereafter are mainly used to fabricate n-channel memory devices, p-channel memory devices can be easily fabricated by changing the doping type implanted. The thin tunneling dielectric layer 301 is preferably a thermal-oxide layer or a nitrided thermal-oxide layer; the first conductive layer 302 is preferably made of polycrystalline-silicon or amorphous-silicon; the first masking dielectric layer 303 is preferably made of silicon-nitrides.

Figure 3B:
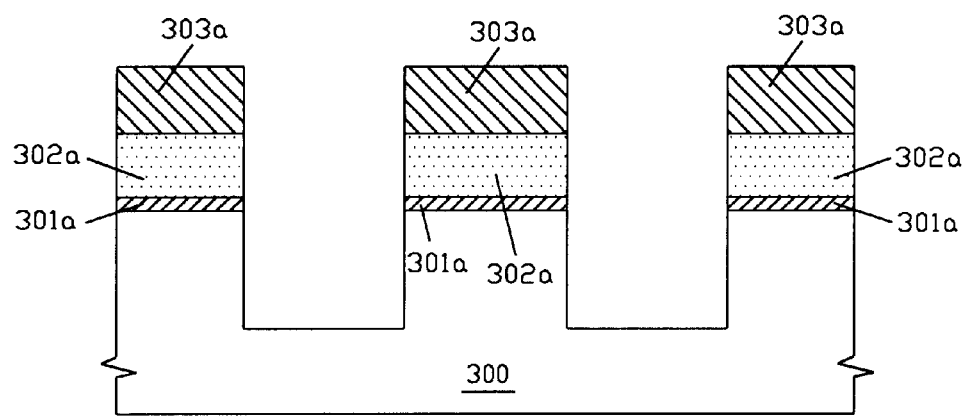
Figure 3C:
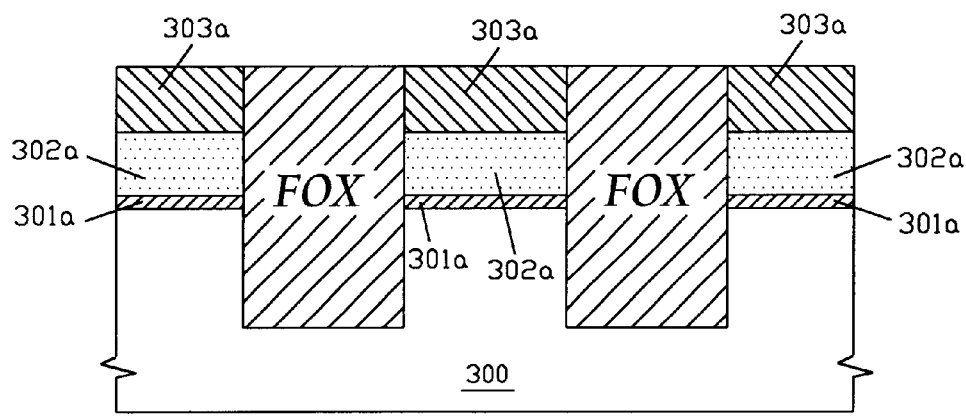

FIG. 3B shows that the first masking dielectric layer 303, the first conductive layer 302, and the thin tunneling dielectric layer 301 outside of the patterned masking photoresist PR1 are anisotropically etched, a plurality of shallow trenches are formed in the semiconductor substrate 300, and then the patterned masking photoresist PR1 is stripped. Subsequently, the plurality of shallow trenches are filled with planarized field-oxides (FOX), as shown in FIG. 3C. The structure shown in FIG. 3C is obtained by first depositing a thick silicon-oxide film over the structure shown in FIG. 3B and then planarizing the thick silicon-oxide film using etch-back or chemical-mechanical polishing (CMP) with the first masking dielectric layer 303a acting as a polishing stop. It should be noted that there are two other methods for forming the structure shown in FIG. 3C. The first method is that a thermal oxidation process or a CVD oxidation process is performed to form a thin-oxide layer over the sidewalls of the first conductive layer 302a and the semiconductor surface of shallow trenches for eliminating the trench-induced defects over the semiconductor surface and then planarized field-oxides are formed, the thin-oxide layer formed becomes also a part of planarized field-oxides (FOX) shown in FIG. 3C. The second method is that the patterned masking photoresist PR1 is stripped before etching the shallow trenches, a thin silicon-oxide spacer is formed over the sidewalls of the first masking dielectric layer 303a, the first conductive layer 302a, and the thin tunneling-dielectric layer 301a, then the semiconductor substrate 300 is anisotripically etched to form the shallow trenches, and subsequently, the semiconductor surfaces of the shallow trenches are oxidized to form a thin-oxide layer, and planarized field-oxides are then formed, the thin-oxide layer and the thin silicon-oxide spacers formed become also a part of planarized field-oxides shown in FIG. 3C. The first method may slightly reduce the channel-width of the active region due to oxidation; the second method will not reduce the channel width of the active region through the formation of thin silicon-oxide spacers.

Figure 3D:
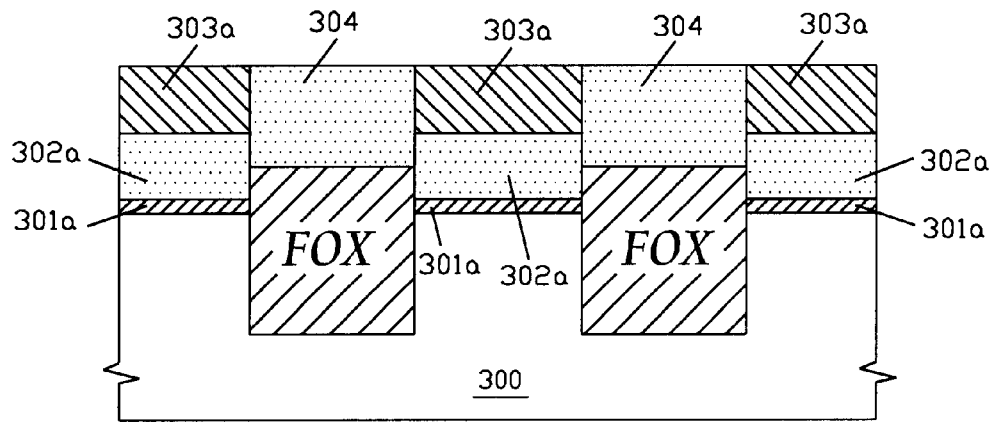

FIG. 3D shows that the planarized field-oxides shown in FIG. 3C are etched back to a depth slightly larger than the thickness of the first masking dielectric layer 303a and then planarized second conductive layer 304 are formed to fill the gaps. The planarized second conductive layers are formed by first depositing a thick second conductive layer and then planarzing the deposited thick second conductive layer with the first masking dielectric layer 303a acting as a polishing stop, as shown in FIG. 3D. Subsequently, the planarized second conductive layers 304 are etched back to a depth approximately equal to the thickness of the first masking dielectric layer 303a for obtaining a flat surface formed by the first conductive layer 302a and the second conductive layer 304a, as shown in FIG. 4E. It should be noted that the etching depth of the planarized second conductive layer 304 can be smaller than the thickness of the first masking dielectric layer 303a; however, a step is formed between the first conductive layer 302a and the second conductive layer 304a, the coupling ratio of the floating-gate layer will be larger, but the non-planarized surface isn't favorable for fine-line lithography of the stack-gate structure.

Figure 3E:
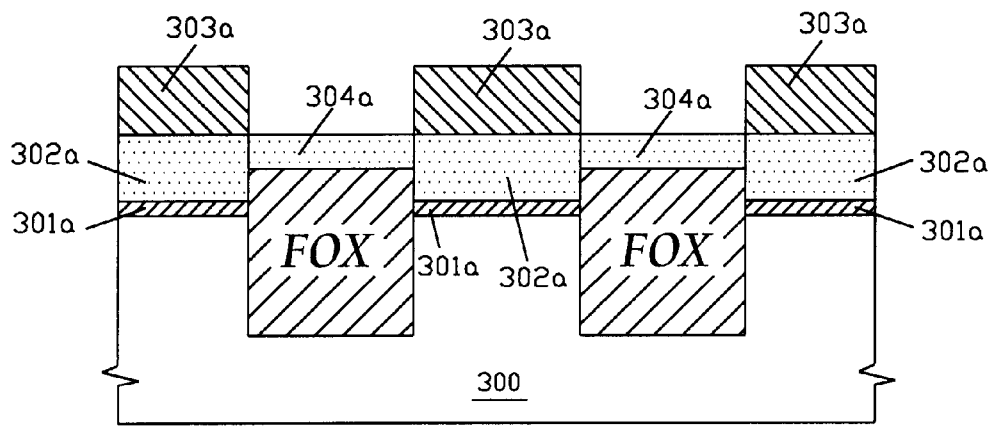
Figure 3F:
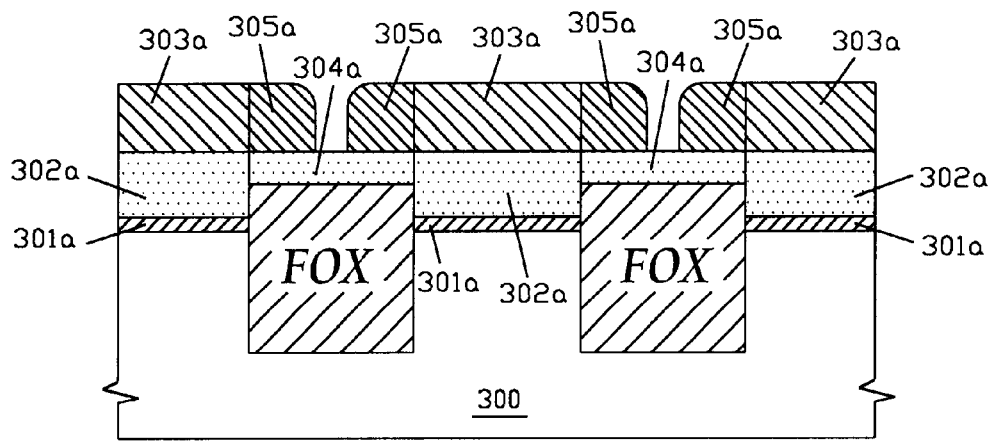
Figure 3G:
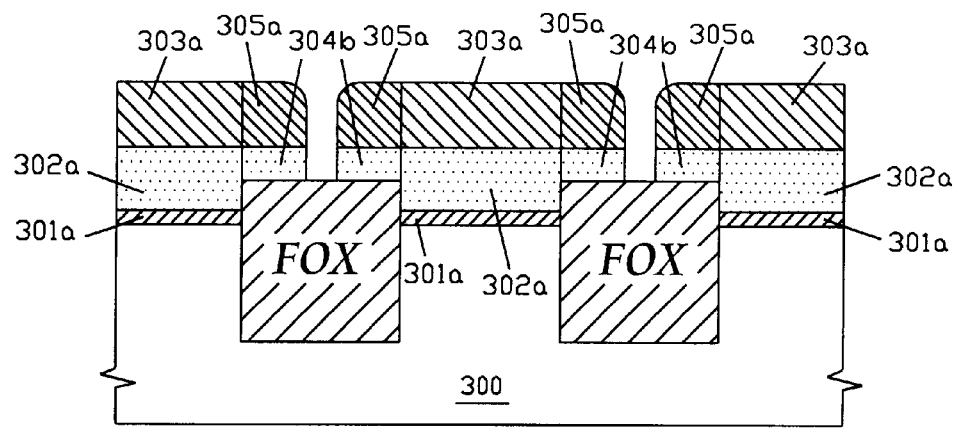
Figure 3H:
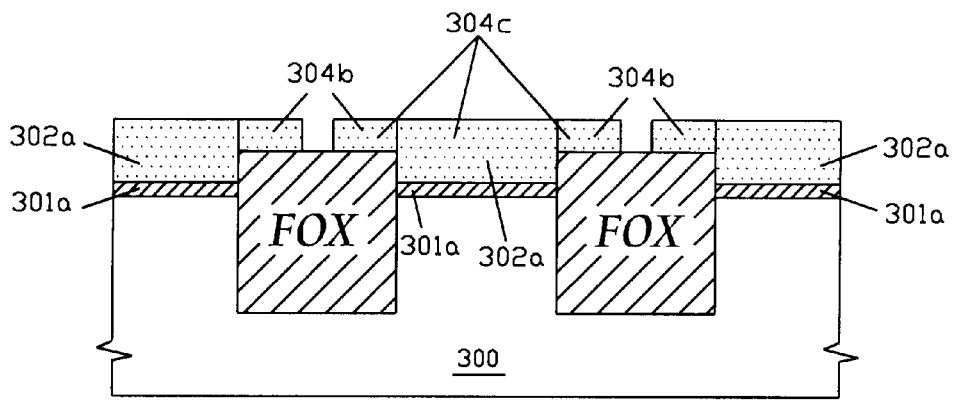

FIG. 3F shows that the first dielectric spacers 305a are formed over the sidewalls of the first masking dielectric layers 303a by first depositing a conformal dielectric layer 305 over the structure shown in FIG. 3E and then anisotropically etching back the thickness of the deposited conformal dielectric layer 305. The first dielectric spacer 305a is preferably made of silicon-nitrides. Subsequently, the second conductive layer 304a is anisotropically etched by using the first masking dielectric layer 303a and the first dielectric spacer 305a as an etching hard mask, as shown in FIG. 3G. FIG. 3H shows that the first masking dielectric layers 303a and the first dielectric spacers 305a shown in FIG. 3G are removed by using hot phosphoric-acid or anisotropic dry etching. It should be noted that a first conductive layer 302a and two second conductive layers 304b form a self-aligned integrated floating-gate layer 304c of the present invention.

Figure 3I:
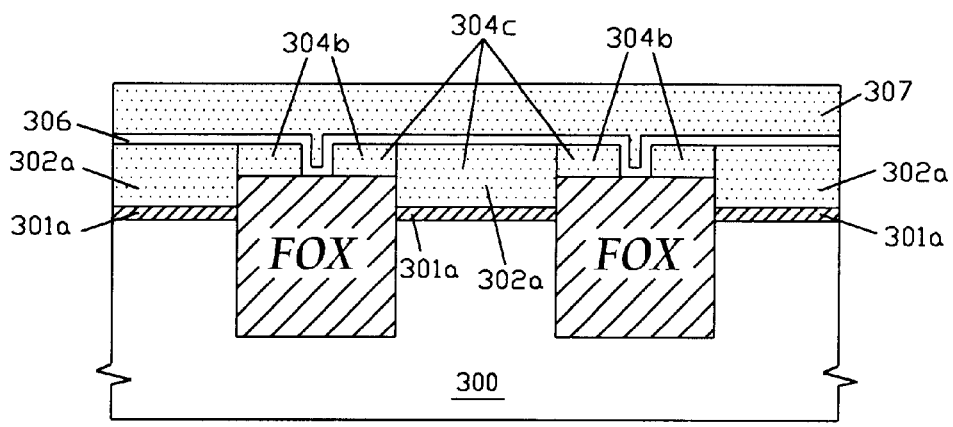

FIG. 3I shows that an intergate dielectric layer 306 is formed over the structure shown in FIG. 3H, and subsequently, a high dose of doping impurities opposite to the dopant type of the semiconductor substrate 300 are implanted into the self-aligned integrated floating-gate layers 304c (not shown) and a third conductive layer 307 is then formed over the intergate dielectric layer 306. The intergate dielectric layer 306 is preferably a composite dielectric layer of a silicon-oxide/silicon-nitride/silicon-oxide (ONO) structure or a silicon-nitride/silicon-oxide structure. The third conductive layer 307 is preferably a composite conductive layer of a metal/barrier-metal/doped polycrystalline- or amorphous-silicon structure or a silicide/barrier-metal/ doped polycrystalline- or amorphous-silicon structure. The barrier-metal layer used is preferably a refractory-metal nitride layer such as titanium-nitride (TiN) or tantalum-nitride (TaN); the metal layer used is preferably a high melting-point metal layer such as tungsten (W); the silicide layer used is preferably a high melting-point silicide layer such as tungsten-silicide ($WSi_2$). It should be noted that the barrier-metal layer is used to prevent the reaction of the metal or silicide layer and the doped polycrystalline- or amorphous-silicon layer and further to prevent the large increase of metal or silicide sheet resistance due to the silicide agglomeration effect. The doped polycrystalline- or amorphous-silicon is implanted (not shown) with a high-dose of doping impurities across the barrier-metal layer and is acted as a buffer layer between the intergate dielectric layer 306 and the barrier-metal layer. The implanted impurities are preferably phosphorous or arsenic impurities.

Figure 4A:
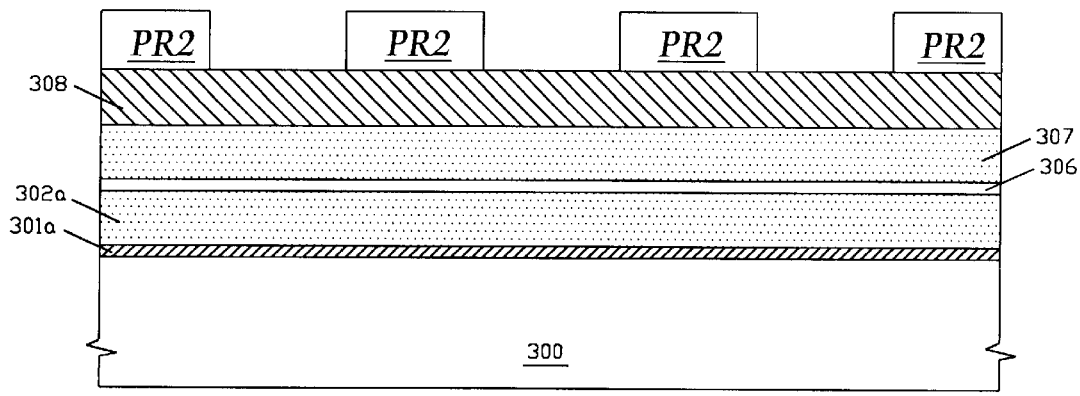
FIG. 4A through FIG. 4G show the process steps and their cross-sectional views for fabricating a NOR-type stack-gate flash memory array having self-registered common-source bus lines and self-registered common-drain landing islands of the present invention.
Figure 4B:
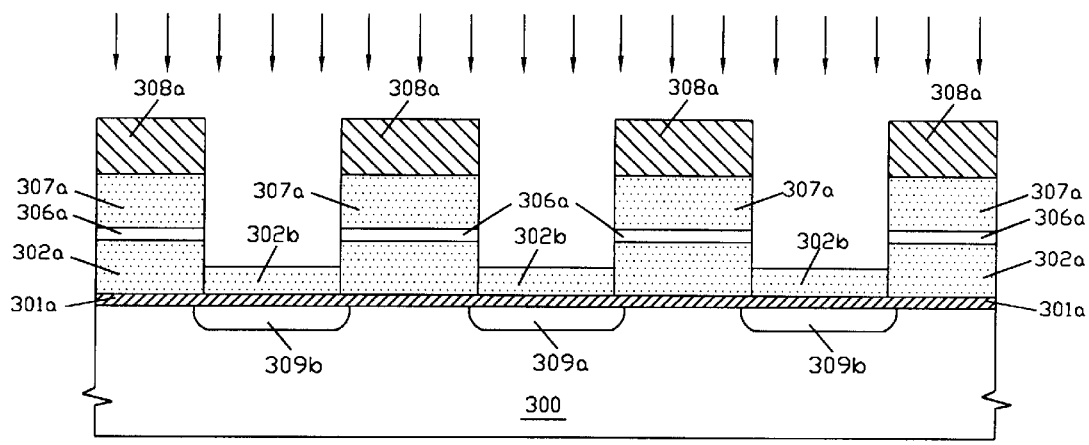
Figure 4B:
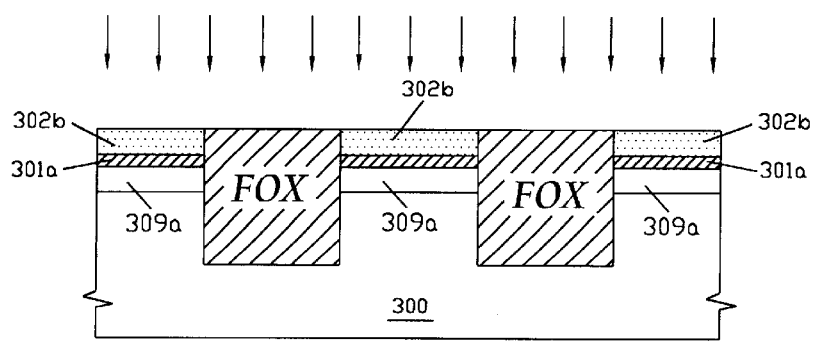
Figure 4C:
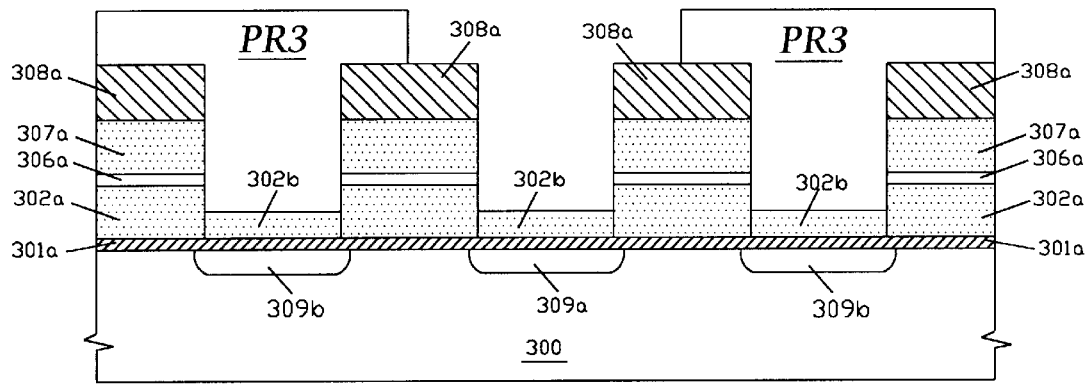
Figure 4C:
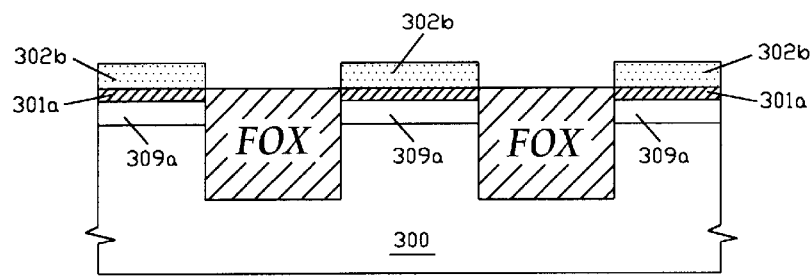
Figure 4C:
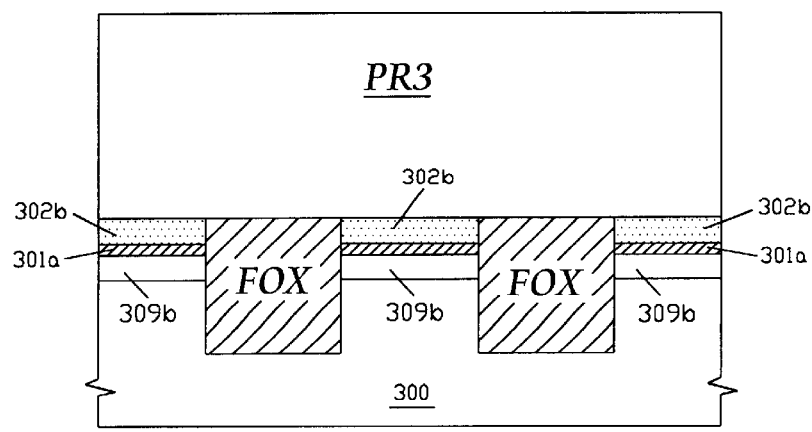
Figure 4D:
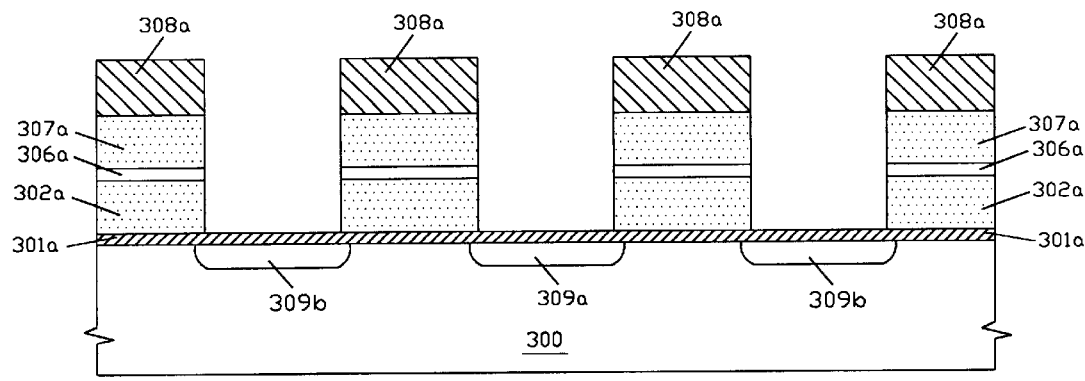
Figure 4D:
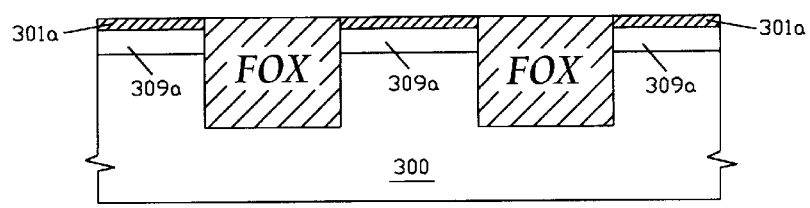
Figure 4D:
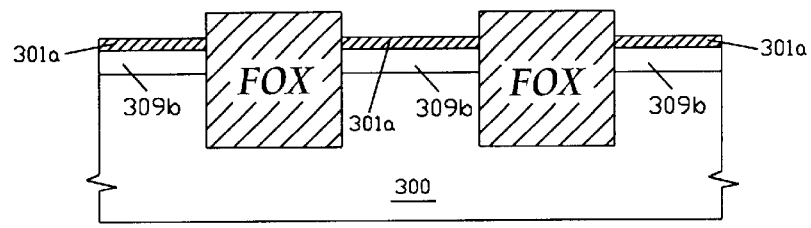
Figure 4E:
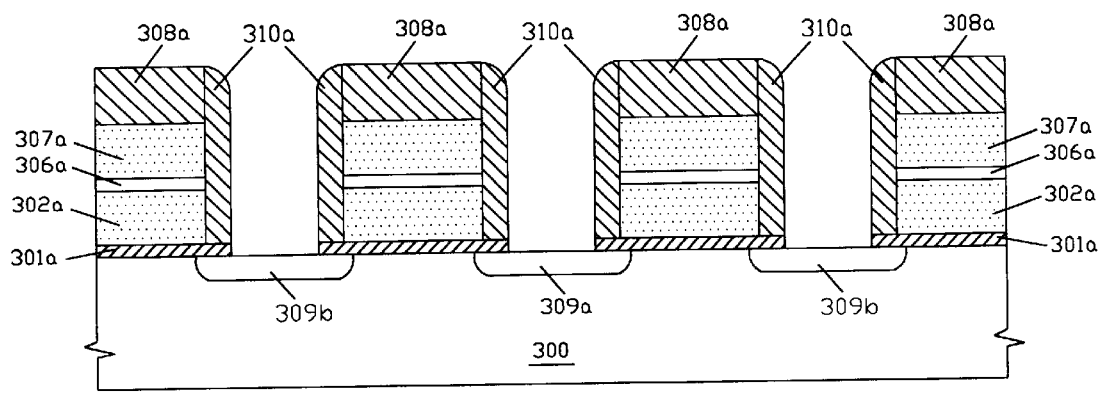
Figure 4E:
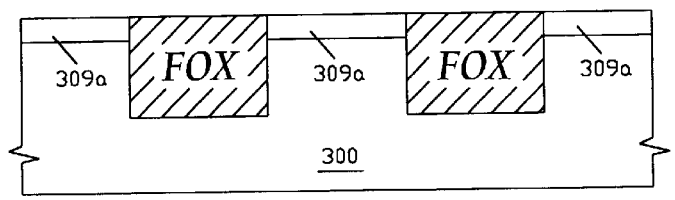
Figure 4E:
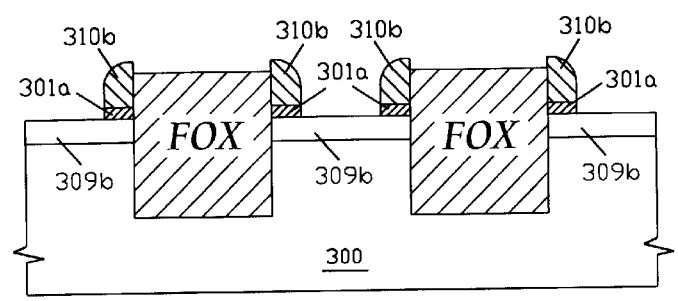

Now referring to FIG. 4A through FIG. 4G, there are shown the process steps and their cross-sectional views for fabricating a plurality of stack-gate flash memory cells and a NOR-type memory array. FIG. 4A shows that the second masking dielectric layer 308 is formed over the structure shown in FIG. 3I and a patterned masking photoresist PR2 is formed over the second masking dielectric layer 308 to define a plurality of word lines perpendicularly to the plurality of shallow-trench-isolation (STI) lines, as shown in FIG. 3I. The second masking dielectric layer 308 is preferably a silicon-oxynitride layer or a composite dielectric layer such as a silicon-nitride/silicon-oxide layer.

FIG. 4B(a) shows that the structure of FIG. 4A is anisotropically etched to remove the second masking dielectric layer 308, the third conductive layer 307, the intergate dielectric layer 306, and a thickness of the extended floating-gate layer 304b in a self-aligned integrated floating-gate layer 304c. FIG. 4B(b) shows a cross-sectional view of a common source/drain diffusion line (B–B' & C–C' of FIG. 2A), in which the extended floating-gate layers 304b are removed. Subsequently, the symmetrical source/drain diffusion regions 309a, 309b are formed in a self-aligned manner by implanting doping impurities across the remained floating-gate layer 302b into the semiconductor substrate 300. The implanted impurities can be phosphorous or arsenic impurities and the dose of doping impurities can be a high dose or a moderate dose, depending on the operation mechanism of the flash memory cell.

FIG. 4C(a) shows that the patterned masking photoresist PR3 is formed over the drain diffusion region and a portion of the second masking dielectric layers 308a to expose the common-source bus line (B–B'). Subsequently, the field-oxides (FOX) in the common-source bus line are anisotropically etched to a depth approximately equal to the thickness of the remained floating-gate layer 302b, as shown in FIG. 4C(b). Since the drain diffusion lines (DL) are covered by the patterned masking photoresist PR3, the field-oxides (FOX) along the drain diffusion line are not etched, as shown in FIG. 4C(c). It should be noted that the asymmetrical source/drain diffusion region can be formed by implanting the doping impurities across the remained first conductive layer 302b by using the patterned masking photoresist PR3 as shown in FIG. 4C(a). For example, the deeper source diffusion region is formed by first implanting a moderate dose of doping impurities and then the patterned masking photoresist PR3 is stripped, a shallow heavily-doped source/drain diffusion is then formed in a self-aligned manner and, subsequently, a rapid thermal annealing is performed to redistribute the implanted doping impurities. The doping impurities of the deeper source diffusion region are preferably phosphorous impurities and the doping impurities of the shallow heavily-doped source/drain diffusion region are arsenic impurities. It is clearly seen that no additional masking photoresist step is required for forming an asymmetrical source/drain diffusion region.

FIG. 4D(a) shows that the remained floating-gate layers 302b are anisotropically removed in a self-aligned manner. FIG. 4D(b) shows a flat surface along the common-source line (B–B'); FIG. 4D(c) shows that the step structure is formed over the drain diffusion line (C–C'), in which the top surface of the field-oxides (FOX) is higher than the top surface of the thin tunneling dielectric layer 301a.

FIG. 4E(a) shows that the second dielectric spacers 310a are formed over the sidewalls of the stack-gate structure and on the thin tunneling dielectric layer 301a, as shown in FIG. 4E(a), and the thin tunneling dielectric layer 301a between the second dielectric spacers 310a is etched by dipping in a dilute hydraflouric acid or anisotropic dry etching. FIG. 4E(b) shows a flat bed is formed along the common-source line. FIG. 4E(c) shows the structure along the drain diffusion line (C–C'), in which the third dielectric spacers 310b are also formed over the sidewalls of the field-oxides (FOX) and on the thin tunneling dielectric layer 301a. The top surface of the field-oxides (FOX) is slightly lowered due to the simultaneous etchings of the thin tunneling dielectric layer 301a and the field-oxides (FOX). The second and third dielectric spacers 310a, 310b are preferably made of silicon-nitrides and their formation techniques are the same as the first dielectric spacers 305a. Subsequently, a thick fourth conductive layer 311 is deposited over the structure shown in FIG. 4E(a) and the planarization is performed by using CMP (not shown), and the planarized fourth conductive layers are etched back to a level approximately equal to the top level of the third dielectric spacers 310b. The fourth conductive layer 311 is preferably made of polycrystalline- or amorphous-silicon.

Figure 4F:
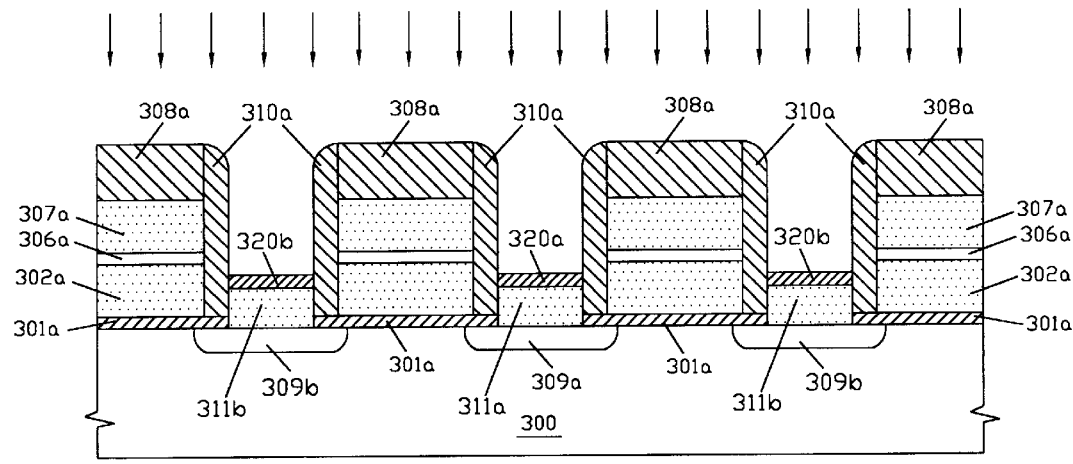
Figure 4F:
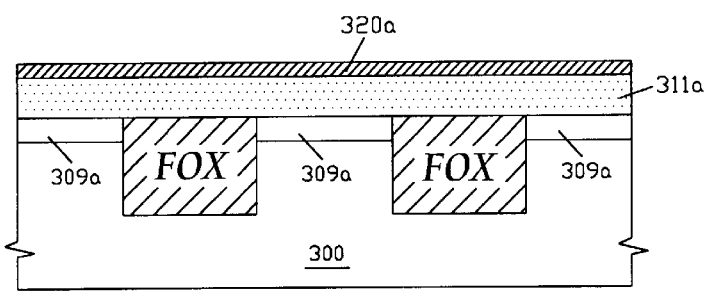
Figure 4F:
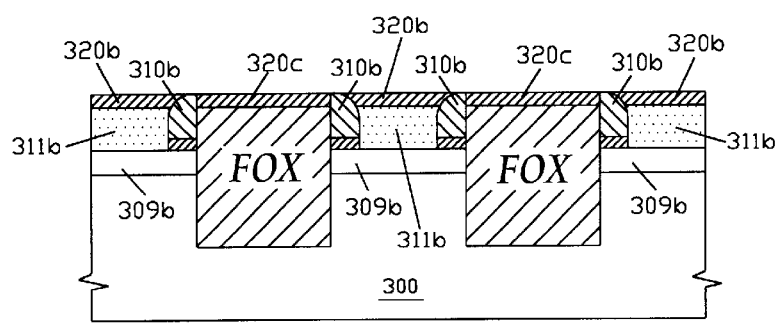

FIG. 4F(a) shows that the etched-back fourth conductive layer 311a, 311b is oxidized to form a thin poly-oxide layer 320a, 320b and the remained thin fourth conductive layer is oxidized to form a thin poly-oxide layer 320c. Subsequently, a high dose of doping impurities with a dopant type opposite to that of the semiconductor substrate 300 are implanted across the thin poly-oxide layer 320a, 320b into the fourth conductive layers 311a, 311b to be acted as a self-aligned dopant diffusion source for forming a shallow heavily-doped source/drain diffusion regions 312a, 312b. FIG. 4F(b) shows a cross-sectional view along the common-source line (B–B'), in which the etched-back fourth conductive layer 311a is acted as a self-registered common-source bus line and the thin poly-oxide layer 320a formed becomes a sacrificial-oxide layer for ion-implantation to heavily dope the self-registered common-source bus line 311a as a self-aligned dopant diffusion source for forming a shallow heavily-doped common-source diffusion region 312a. FIG. 4F(c) shows a cross-sectional view along the drain diffusion line (C–C'), in which the etched-back fourth conductive layer 311b is formed over the drain diffusion regions 309b between two second dielectric spacers 310a and two third dielectric spacers 310b and is acted as a self-registered drain landing island. The thin poly-oxide layer 320b formed over the self-registered drain landing island 311b is also used as a sacrificial oxide layer for ion-implantation to heavily dope the self-registered drain landing island 311b as a self-aligned dopant diffusion source for forming a shallow heavily-doped drain diffusion region 312b.

Figure 4G:
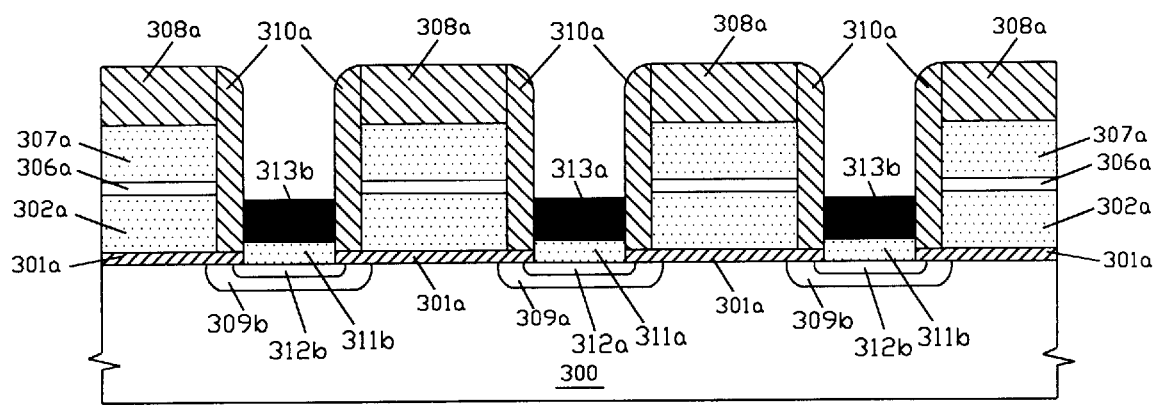
Figure 4G:
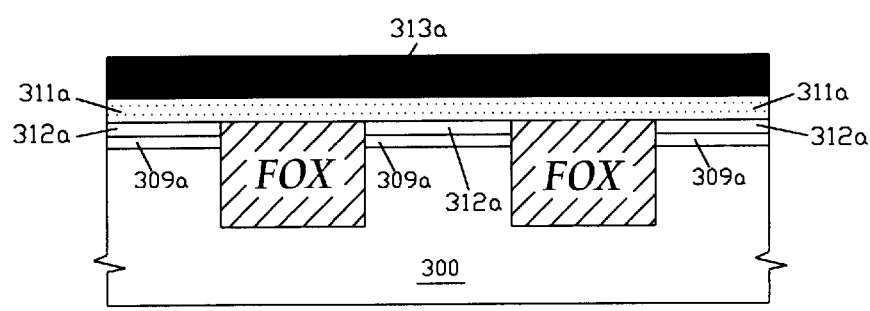
Figure 4G:
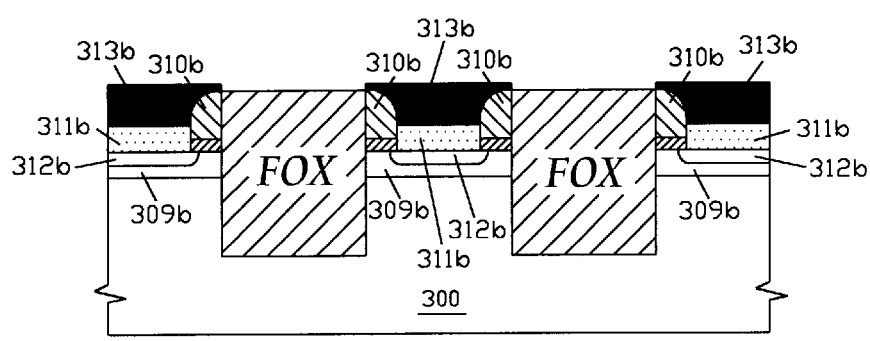

FIG. 4G(a) shows that a rapid thermal annealing process is performed to form a shallow heavily-doped source/drain diffusion region 312a, 312b within the source/drain diffusion region 309a, 309b, and then the poly-oxide layers 320a, 320b, 320c are removed (not shown). Subsequently, a self-aligned silicidation process is performed to form a silicide layer 313a, 313b over the self-registered common-source bus lines 311a and the self-registered drain landing islands 311b. The poly-oxide layers 320a, 320b and 320c are etched by dipping in a dilute hydraflouric acid or using anisotropic dry etching. The self-aligned silicidation process is performed by first depositing a refractory-metal layer over the structure and then heating in a nitrogen or argon ambient using rapid thermal annealing to form a silicide layer 313a over the self-registered common-source bus lines 311a and a silicide layer 313b over the self-registered drain landing islands 311b, and the unreacted metal is etched by a chemical solution. The refractory-metal layer is preferably made of titanium (Ti), cobalt (Co), tantalum (Ta), molybdenum (Mo), nickle (Ni), platinum (Pt) or tungsten (W). FIG. 4G(b) shows that a silcide layer 313a is formed over the self-registered common-source bus lines 311a and a shallow heavily-doped source diffusion region 312a is formed within the deeper source diffusion region 309a. The self-registered common-source bus line 311a is formed over a flat bed formed by the shallow heavily-doped source diffusion regions 312a and the field-oxides (FOX), the effective bus line length of the self-registered common-source bus line is much shorter than that of the conventional buried common-source bus line of the prior arts. Similarly, the parasitic capacitance and the junction leakage current between the self-registered common-source bus line 311a and the semiconductor substrate 300 are much reduced as compared to the prior arts. FIG. 4G(c) shows that a silicide layer 313b is formed over the self-registered drain landing islands 311b and a shallow heavily-doped drain diffusion region is formed within a deeper drain diffusion region 309b. The self-registered drain landing island 311b not only removes the contact problem for shallow drain diffusion junction, but also offer an elevated contact pad to reduce the contact height of the bit line. As a consequence, the contact size can be reduced and the density of flash memory array can be further increased. It should be noted that the self-registered common-source bus line 311a and the self-registered drain landing island 311b can be completely converted into a thicker silicide layer by using the self-aligned silicidation process (not shown), the bus-line resistance of the self-registered common-source bus line can be further reduced and the contact resistance for the shallow heavily-doped source/drain diffusion region can also be reduced. Moreover, for a NAND-type architecture the memory cells in a row are interconnected by the source/drain diffusion region, the completely silicided source/drain landing island may largely reduce the series resistance of the interconnection.

Subsequently, a thick planarized interlayer dielectric layer 314a is formed over the whole structure, a masking photoresist step is performed to form the self-aligned contact holes 321b for the silicided self-registered drain landing islands 311b, a thin first barrier-metal layer 315 is formed over the self-aligned contact holes and a thick plug metal 316 is deposited to fill up the self-aligned contact holes 321b, then CMP or etch-back is used to planarize the surface to form the first barrier-metal layers 315a and the metal plugs 316a. Thereafter, a second barrier-metal layer 317 and a first interconnect metal layer 318 are sequentially formed over the structure, and a masking photoresist step is performed to define a plurality of bit lines perpendicular to the plurality of word lines, as shown in FIG. 2B; a cross-sectional view along the common-source line (B–B') is shown in FIG. 2C; a cross-sectional view along the drain diffusion line (C–C') is shown in FIG. 2D; and a cross-sectional view along the word line (D–D') is shown in FIG. 2E. The interlayer dielectric layer 314a is preferably made of silicon-oxides or doped silicon-oxides, such as pure glass, p-glass or BP-glass; the first and second barrier-metal layers 315a, 317a are preferably made of refractory-metal nitrides, such as titanium-nitride (TiN) or tantalum-nitride (TaN); the metal plug 316a is preferably made of tungsten or aluminum; the first interconnect-metal line 318a is preferably made of aluminum, AlSiCu alloy or copper.

It should be noted that FIG. 2A through FIG. 2D show a NOR-type stack-gate flash memory array as an example, the other array architectures can be easily implemented by using the key technologies of the present invention to take advantages of the present invention. Moreover, the stack-gate flash memory cells shown in FIG. 2A through FIG. 2D all have symmetrical source/drain diffusion regions; however, the asymmetrical source/drain diffusion regions can be easily implemented without the additional masking photoresist step, as described.

While the present invention has been particularly shown and described with a reference to the present examples and embodiments as considered as illustrative and not restrictive. Moreover, the present invention is not to be limited to the details given herein, it will be understood by those skilled in the art that various changes in form and details may be made without departure from the true spirit and scope of the present invention.

What is claimed is:

1. A method of fabricating a stack-gate flash memory array on a semiconductor substrate comprising:

forming a shallow-trench-isolation (STI) structure on said semiconductor substrate having a plurality of parallel STI lines formed alternately and a plurality of parallel active-region lines formed therebetween, wherein each of said plurality of parallel active-region lines has a major first conductive layer being formed on a thin tunneling dielectric layer and each of said plurality of parallel STI lines has two extended second conductive layers being formed on each of a plurality of planarized field-oxides (FOX);

wherein said major first conductive layer is electrically connected with two neighboring extended second conductive layers to form a self-aligned integrated floating-gate layer;

forming sequentially an intergate dielectric layer, a third conductive layer, and a second masking dielectric layer over said STI structure;

patterning a plurality of parallel word lines perpendicular to said plurality of parallel STI lines followed by sequentially removing said second masking dielectric layer, said third conductive layer, said intergate dielectric layer, and etching said self-aligned integrated floating-gate layer to a thickness of said extended second conductive layer, wherein said extended second conductive layers over each of said plurality of planarized field-oxides outside of said plurality of parallel word lines are removed and said major first conductive layer is partially etched to have a remained first conductive layer over each of said plurality of parallel active-region lines outside of said plurality of parallel word lines;

implanting doping impurities having a dopant type opposite to that of said semiconductor substrate across said remained first conductive layer and said thin tunneling dielectric layers in a self-aligned manner into said semiconductor substrate along said plurality of parallel active-region lines to form a plurality of first symmetrical common-source/drain diffusion regions;

etching back anisotropically said plurality of planarized field-oxides along designated common-bus lines to a depth approximately equal to a thickness of said remained first conductive layer and then removing anisotropically said remained first conductive layers in a self-aligned manner;

forming second dielectric spacers over sidewalls of said plurality of parallel word lines and simultaneously forming third dielectric spacers over sidewalls of said plurality of planarized field-oxides;

removing said thin tunneling dielectric layers over said semiconductor substrate along said plurality of parallel active-region lines and simultaneously etching said plurality of planarized field-oxides along said plurality of parallel STI lines in a self-aligned manner to form a plurality of flat beds along said designated common-bus lines and to expose a plurality of common-source/drain contact holes;

forming a fourth conductive layer over each of said plurality of flat beds as a self-registered common-bus line and over each of said plurality of common-source/drain contact holes as a self-registered common-source/drain landing island, wherein said fourth conductive layer is implanted with a high dose of doping impurities having a dopant type opposite to that of said semiconductor substrate to act as a self-aligned dopant diffusion source for forming a plurality of shallow heavily-doped common-source/drain diffusion regions within said plurality of first symmetrical common-source/drain diffusion regions; and forming a self-aligned silicide layer over each of said plurality of self-registered common-bus lines and each of said plurality of self-registered source/drain landing islands.

2. The method of claim 1, wherein said method further comprises:

forming a planarized interlayer dielectric layer over the formed structure and then forming a plurality of self-aligned contact holes over designated said plurality of self-registered common-source/drain landing islands, wherein each of said plurality of self-aligned contact holes is filled with a planarized metal-plug lined with a first barrier-metal layer;

forming sequentially a second barrier-metal layer and a first interconnect-metal layer over said planarized interlayer dielectric layer, said planarized metal-plugs, and said first barrier-metal layers; and patterning and etching anisotropically said first interconnect-metal layer and said second barrier-metal layer to form a plurality of parallel bit lines above said plurality of parallel active-region lines.

3. The method of claim 1, wherein said STI structure is fabricated by the steps comprising:

forming sequentially said thin tunneling dielectric layer, said first conductive layer, and a first masking silicon-nitride layer over said semiconductor substrate to form a multilayer structure;

patterning said multilayer structure to define said plurality of parallel active-region lines and etching anisotropically said multilayer structure and said semiconductor substrate to form a plurality of parallel shallow trenches;

oxidizing etched sidewalls of said multilayer structure and etched semiconductor surface of said plurality of parallel shallow trenches and then depositing a thick silicon-oxide film to fill up gaps formed by said plurality of parallel shallow trenches followed by planarizing said thick silicon-oxide film to form said plurality of planarized field-oxides (FOX) using etch-back or chemical-mechanical polishing (CMP) with said first masking silicon-nitride layer as a polishing stop;

etching back anisotropically said plurality of planarized field-oxides to a depth slightly larger than a thickness of said first masking silicon-nitride layer;

depositing a thick second conductive film to fill up etched-back gaps followed by planarizing said thick second conductive film to form a plurality of planarized second conductive layers using etch-back or CMP with said first masking silicon-nitride layer as a polishing stop;

etching back anisotropically said plurality of planarized second conductive layers to a depth equal to or smaller than a thickness of said first masking silicon-nitride layer;

forming first silicon-nitride spacers over sidewalls of said first masking silicon-nitride layers and on a plurality of etched-back planarized second conductive layers;

etching anisotropically said plurality of etched-back planarized second conductive layers using said first masking silicon-nitride layers and said first silicon-nitride spacers as an etching hard mask to form said two extended second conductive layers over each of said plurality of planarized field-oxides; and removing said first masking silicon-nitride layers and said first silicon-nitride spacers to form said STI structure having said self-aligned integrated floating-gate layers.

4. The method of claim 1, wherein said STI structure is fabricated by the steps comprising:

forming sequentially said thin tunneling dielectric layer, said first conductive layer, and a first masking silicon-nitride layer over said semiconductor substrate to form a multilayer structure;

patterning said multilayer structure to define said plurality of parallel active-region lines and etching anisotropically said multilayer structure;

forming silicon-oxide spacers over sidewalls of etched multilayer structure and on said semiconductor substrate followed by etching anisotropically said semiconductor substrate to form a plurality of parallel shallow trenches;

oxidizing etched semiconductor surface of said plurality of parallel shallow trenches and then depositing a thick silicon-oxide film to fill up gaps formed by said plurality of parallel shallow trenches followed by planarizing said thick silicon-oxide film to form said plurality of planarized field-oxides (FOX) using etch-back or CMP with said first masking silicon-nitride layer as a polishing stop;

etching back anisotropically said plurality of planarized field-oxides to a depth slightly larger than a thickness of said first masking silicon-nitride layer;

depositing a thick second conductive film to fill up etched gaps followed by planarizing said thick second conductive film to form a plurality of planarized second conductive layers using etch-back or CMP with said first masking silicon-nitride layer as a polishing stop;

etching back anisotropically said plurality of planarized second conductive layers to a depth equal to or smaller than a thickness of said first masking silicon-nitride layer;

forming first silicon-nitride spacers over sidewalls of said first masking silicon-nitride layers and on etched-back planarized second conductive layers;

etching anisotropically said etched-back planarized second conductive layers using said first masking silicon-nitride layers and said first silicon-nitride spacers as an etching hard mask to form said two extended second conductive layers over each of said plurality of planarized field-oxides; and removing said first masking silicon-nitride layers and said first silicon-nitride spacers to form said STI structure having said self-aligned integrated floating-gate layers.

5. The method of claim 1, wherein said thin tunneling dielectric layer is preferably a thermal-oxide layer or a nitrided thermal-oxide layer, and said intergate dielectric layer is preferably a composite dielectric layer of silicon oxide-silicon nitride-silicon oxide (ONO) or silicon nitride-silicon oxide.

6. The method of claim 1, wherein said first conductive layer, said second conductive layer and said fourth conductive layer are preferably made of polycrystalline-silicon or amorphous-silicon.

7. The method of claim 1, wherein said third conductive layer is preferably a composite conductive layer of metal over barrier-metal over doped polycrystalline- or amorphous-silicon, said metal is preferably made of high melting-point metal such as tungsten, and said barrier-metal is preferably refractory-metal nitrides such as titanium-nitride (TiN) or tantalum-nitride (TaN).

8. The method of claim 1, wherein said third conductive layer is preferably a composite conductive layer of silicide over barrier-metal over doped polycrystalline- or amorphous-silicon, said silicide is preferably made of refractory-metal silicides such as tungsten-silicide, and said barrier-metal is preferably made of refractory-metal nitrides such as titanium-nitride (TiN) or tantalum-nitride (TaN).

9. The method of claim 1, wherein said second dielectric spacer and said third dielectric spacer is preferably made of silicon-nitrides, and said second masking dielectric layer is preferably made of silicon-oxynitride or silicon-nitride over silicon-oxide.

10. The method of claim 1, wherein said self-registered common-bus line and said self-registered common source/drain landing island are fabricated by the steps comprising:

depositing a thick fourth conductive film over the formed structure;

planarizing said thick fourth conductive film using etch-back or CMP with said second masking dielectric layer as a polishing stop to form planarized fourth conductive layers; and etching back said planarized fourth conductive layers to a level approximately equal to a top surface of said third dielectric spacer to form said fourth conductive layer.

11. The method of claim 1, wherein said self-aligned silicide layer being formed over said self-registered common-bus lines and said self-registered source/drain landing islands is preferably made of refractory-metal silicides such as $TiSi_2$, $CoSi_2$, $NiSi_2$, $TaSi_2$, $MoSi_2$, $PtSi_2$ or $WSi_2$ etc.

12. The method of claim 1, wherein said self-registered common-bus line and said self-registered source/drain landing island is completely converted into a thick silicide layer by depositing a thicker refractory-metal layer through changing annealing temperature or time during a self-aligned silicidation process.

13. The method of claim 2, wherein said first barrier-metal layer and said second barrier-metal layer is preferably made of refractory-metal nitrides such as titanium-nitride (TiN) or tantalum-nitride (TaN).

14. The method of claim 2, wherein said plug metal is preferably made of tungsten or aluminum, and said first interconnect-metal layer is preferably made of aluminum (Al), aluminum-silicon-copper (AlSiCu) alloy, or copper (Cu).

15. A method of fabricating a stack-gate flash memory array on a semiconductor substrate comprising:

forming a plurality of parallel STI lines alternately having a plurality of parallel active-region lines formed therebetween, wherein each of said plurality of parallel active-region lines has a major floating-gate layer formed on a thin tunneling dielectric layer and each of said plurality of parallel STI lines has two extended floating-gate layers formed on each of a plurality of planarized field-oxides;

wherein said major floating-gate layer is electrically connected to two neighboring extended floating-gate layers to form a self-aligned integrated floating-gate layer;

forming a plurality of stack-gate flash memory cells on said plurality of parallel active-region lines having a plurality of parallel word lines formed perpendicularly to said plurality of parallel active-region lines, wherein each of said plurality of parallel word lines comprises a continuous control-gate layer;

forming a plurality of common source/drain diffusion regions of said plurality of stack-gate flash memory cells;

creating a plurality of flat beds formed by said plurality of common-source/drain diffusion regions and said plurality of planarized field-oxides along designated common-bus lines for a specified memory array architecture;

forming a plurality of self-registered common-bus lines over said plurality of flat beds between second dielectric spacers formed over sidewalls of said plurality of parallel word lines and forming a plurality of self-registered common-source/drain landing islands over said plurality of common source/drain diffusion regions between said second dielectric spacers and third dielectric spacers formed over sidewalls of said plurality of planarized field-oxides;

forming a plurality of parallel bit lines perpendicular to said plurality of parallel word lines, wherein each of said plurality of parallel bit lines is connected through a plurality of self-aligned contact holes formed in a planarized thick interlayer dielectric layer to said plurality of self-registered common-drain landing islands designated for said specified memory array architecture.

16. The method of claim 15, wherein said self-aligned integrated floating-gate layer is preferably made of polycrystalline- or amorphous-silicon being implanted with a high dose of doping impurities having a dopant type opposite to that of said semiconductor substrate.

17. The method of claim 15, wherein said continuous control-gate layer is preferably made of metal over barrier-metal over doped polycrystalline- or amorphous-silicon or silicide over barrier-metal over doped polycrystalline- or amorphous-silicon, said metal is preferably made of a high melting-point metal such as tungsten, said silicide is preferably made of a high melting-point silicide such as tungsten-silicide, and said barrier-metal is preferably made of refractory-metal nitrides such as titanium-nitride (TiN) or tantalum-nitride (TaN).

18. The method of claim 15, wherein said self-registered common-bus line and said self-registered common-source/drain landing island is preferably made of polycrystalline- or amorphous-silicon being implanted with a high-dose of doping impurities with a dopant type opposite to that of said semiconductor substrate and is acted as a self-aligned dopant diffusion source for forming a plurality of shallow heavily-doped common-source/drain diffusion regions within said plurality of common-source/drain diffusion regions.

19. The method of claim 15, wherein said self-registered common-bus line and said self-registered common-source/drain landing island are silicided and can be partially or completely converted into a silicide layer by a self-aligned silicidation process, and said silicide layer is preferably made of refractory-metal suicides such as $TiSi_2$, $CoSi_2$, $TaSi_2$, $NiSi_2$, $MoSi_2$, $PtSi_2$ or $WSi_2$ etc.

20. A method of fabricating a stack-gate flash memory array on a semiconductor substrate comprising:

forming a plurality of stack-gate flash memory cells on a plurality of parallel active-region lines formed between a plurality of parallel STI lines, wherein each of said plurality of stack-gate flash memory cells in a row is connected by a continuous control-gate layer being acted as a word line and each of said plurality of stack-gate flash memory cells comprises a self-aligned integrated floating-gate layer having a major floating-gate layer formed over a thin tunneling dielectric layer and two neighboring extended floating-gate layers formed on planarized field-oxides in said plurality of parallel STI lines;

forming a plurality of common source/drain diffusion regions of said a plurality of stack-gate flash memory cells;

creating a plurality of flat beds formed by said plurality of common source/drain diffusion regions and a plurality of planarized field-oxides along designated common-bus lines for a specified memory array architecture;

forming a plurality of self-registered common-bus lines over said plurality of flat beds between second dielectric spacers formed over sidewalls of a plurality of parallel word lines and forming a plurality of self-registered common-source/drain landing islands over said plurality of common source/drain diffusion regions between said second dielectric spacers and third dielectric spacers formed over sidewalls of said plurality of planarized field-oxides, wherein each of said plurality of self-registered common-bus lines or each of said plurality of self-registered common-source/drain landing islands being implanted with a high dose of doping impurities having a dopant type opposite to that of said semiconductor substrate is acted as a self-aligned dopant diffusion source for forming a plurality of shallow heavily-doped common source/drain diffusion regions within said plurality of common-source/drain diffusion regions;

performing a self-aligned silicidation process to convert partially or completely said plurality of self-registered common-bus lines or said plurality of self-registered common-source/drain landing islands into a plurality of self-aligned silicide layers, said plurality of self-aligned silicide layers are preferably made of refractory-metal silicides; and forming a plurality of parallel bit lines on said plurality of parallel active-region lines, wherein each of said plurality of parallel bit lines is connected through a plurality of self-aligned contact holes formed in a planarized thick interlayer dielectric layer to each of said plurality of self-aligned silicide layers on each of said plurality of self-registered common-source/drain landing islands designated for said specified memory array architecture.

* * * * *